United States Patent [19]
Kyung et al.

[11] Patent Number: 5,778,969
[45] Date of Patent: Jul. 14, 1998

[54] APPARATUS FOR THERMAL TREATMENT OF THIN WAFERS

[75] Inventors: Hyun-Su Kyung; Won-Song Choi; Hueng-Jik Lee; Sek-Young Kim; Jung-Ho Shin; Chang-Hwan Choi, all of Kyungki-Do, Rep. of Korea

[73] Assignee: Novellus Systems, Inc., San Jose, Calif.

[21] Appl. No.: 901,122

[22] PCT Filed: Apr. 28, 1995

[86] PCT No.: PCT/US95/05281

§ 371 Date: Jun. 3, 1996

§ 102(e) Date: Jun. 3, 1996

[87] PCT Pub. No.: WO95/30121

PCT Pub. Date: Nov. 9, 1995

Related U.S. Application Data

[63] Continuation of Ser. No. 571,842, filed as PCT/US95/05281 Apr. 28, 1995, published as WO95/30121 Nov. 9, 1995, abandoned.

[30] Foreign Application Priority Data

Apr. 28, 1994 [KR] Rep. of Korea ............ 1994-109

[51] Int. Cl.⁶ .................................................. F28F 7/00
[52] U.S. Cl. .............................. 165/80.1; 118/725
[58] Field of Search .................. 165/80.1, 80.2, 165/185; 118/725, 728

[56] References Cited

U.S. PATENT DOCUMENTS

| | | | |
|---|---|---|---|
| 5,020,474 | 6/1991 | Tanaka | 118/72 |
| 5,033,538 | 7/1991 | Wagner et al. | 165/80.1 |
| 5,131,460 | 7/1992 | Krueger | 165/80.2 |
| 5,228,501 | 7/1993 | Tepman et al. | 165/80.1 |
| 5,421,893 | 6/1995 | Perlov | 118/725 |

*Primary Examiner*—Leonard R. Leo
*Attorney, Agent, or Firm*—D'Alessandro & Ritchie

[57] ABSTRACT

An apparatus for thermal treatment of a thin film wafer is disclosed including a vacuum chamber (10) with a heater assembly (20) positioned in the vacuum chamber (10) and a clamp (31) which presses against the wafer positioned on the heater assembly (20) with the force of the weight of the clamp (31). A vacuum generator (60) forms a vacuum in the vacuum chamber (10) and a gas supply network (100) supplies gas into the vacuum chamber (20) to provide a uniform temperature for the thermal treatment of the wafer. A wafer supply mechanism (50) supplies the wafer to the clamp (31) for thermal treatment.

16 Claims, 14 Drawing Sheets

APPARATUS FOR THERMAL TREATMENT OF THIN WAFERS

CROSS-REFERENCE TO RELATED APPLICATION

This is a file-wrapper continuation of patent application Ser. No. 08/571,842, filed as PCT/US95/05281 Apr. 28, 1995 published as WO95/30121 Nov. 9, 1995, now abandoned.

FIELD OF THE INVENTION

The present invention relates in general to the processing of thin film wafers and more particularly to an improved apparatus for the thermal treatment of a thin film wafer in a high vacuum condition.

BACKGROUND OF THE INVENTION

Historically there has existed a drive in the semiconductor industry to reduce the size of the circuit elements of an integrated circuit. This both increases the number of circuits in a particular space and increases the speed of those circuits. The number of elements in a particular space is known as the integration density of the circuit where a greater number of elements in a particular space corresponds to a higher integration density.

The drive to higher integration densities, however, has meant that manufacturing methods that worked at a lower integration density might not work at a higher integration density. This is usually due to the minuteness of the resulting dimensions involved at higher integration densities. For example, at the relatively low integration density required for fabricating 1 MB DRAMs and 4 MB DRAMs, the aspect ratio of the height to the width of the elements was also relatively low. As a result, the method of metalization of the contact or via holes by wiring materials connecting the elements was possible by forming a metal film using sputter deposition equipment. However, at the relatively high integration density required for fabricating 64 MB DRAMs and 256 MB DRAMs, the aspect ratio is relatively high and the previous method of using sputter equipment to fill such holes is unsatisfactory. In order to overcome this, new methods are being developed so that a thin film deposited by the sputter equipment can form a metal film by self-diffusion of the atoms. This self-diffusion of the atoms is accomplished by first sputter depositing a thin film on the wafer and then heating the wafer at a temperature below its melting point in a chamber maintained in a continuous vacuum. This is known as a reflow process.

Further, the drive to higher integration densities has meant that manufacturing equipment that worked at a lower integration density might not work at a higher integration density. For example, at relatively low integration densities it was possible to sequentially process the wafers in conventional cluster equipment having a plurality of vacuum chambers for wafer processing. However, at relatively high integration densities the movement of the wafer can result in poor quality due to misalignment and contamination. In order to overcome this, new equipment is being developed so that a wafer is processed individually without being moved if possible. Such equipment allows a high degree of control over process parameters such as temperature distribution, pressure regulation, and contamination elimination.

In an attempt to design equipment to perform the reflow process above, an initial effort was made to combine equipment for the heating of the wafer with the sputter equipment. However, it proved difficult to uniformly heat the entire surface of the wafer to a temperature above or equal to 500° C. and to attain a high degree of vacuum inside the sputter deposition chamber. A separate apparatus for the thermal treatment of the wafer was therefore developed.

In conventional apparatus for the thermal treatment of a thin film wafer, a heater assembly is provided inside a vacuum chamber. The heater assembly is located on an elevator mechanism that controls vertical movement of the heater assembly within the vacuum chamber. A clamp is provided inside the vacuum chamber above the heater assembly for clamping a wafer to the top of the heater assembly during thermal treatment. The conventional method of thermal treatment of a thin film wafer includes placing the wafer in the clamp in the vacuum chamber, raising the heater assembly with the elevator mechanism until the clamp presses the wafer against the top of the heater assembly, heating the wafer with the heater assembly, lowering the heater assembly with the elevator mechanism, and removing the wafer from the clamp. With the conventional method of wafer treatment however problems arise due to the thermal expansion of the heater assembly. The thermal expansion of the heater assembly can result in vertical expansion which is difficult to compensate for which results in the wafer being damaged during the thermal treatment process.

SUMMARY OF THE INVENTION

The present invention solves the above described problems by providing an apparatus for the thermal treatment of a thin film wafer which can uniformly heat the entire surface of the wafer, attain a high degree of vacuum inside the vacuum chamber, and prevent damage to the wafer associated with the clamping of the wafer during thermal treatment.

In general, the present invention is an apparatus for the thermal treatment of a thin film wafer having a peripheral edge. More specifically, the apparatus of the present invention includes a vacuum chamber and a heater assembly positioned in the vacuum chamber. A clamp is positioned in the vacuum chamber and includes a cap and an open bottom in the main body of the clamp. The heater assembly is received through the open bottom of the clamp during use. The clamp has a specific weight for pressing against the wafer supported by the heater block during thermal treatment. A structure for holding the wafer in the clamp prior to and subsequent to thermal treatment of the wafer, such as a plurality of fingers, is provided on the clamp. An elevator mechanism positions the clamp relative to the heater assembly such that in use only the weight of the clamp presses against the wafer. A vacuum generator forms a vacuum in the interior of the chamber and a gas supply network provides inert gas both to the wafer during thermal treatment to maintain the wafer at a uniform temperature and to the vacuum chamber. A cooling network supplies a cooling gas to cool certain parts of the apparatus, namely, the heater assembly, vacuum chamber, and isolation mechanism. The heater assembly supplies heat in order to heat the wafer to the proper temperature. A wafer supply means is used to supply the wafer to the clamp.

The more pertinent and important features of the present invention have been outlined above in order that the detailed description of the invention which follows will be better understood and that the present contribution to the art can be fully appreciated. Additional features of the invention described hereinafter form the subject of the claims of the invention.

BRIEF DESCRIPTION OF THE DRAWINGS

For a fuller understanding of the nature and objects of the invention, reference should be made to the following detailed description taken in conjunction with the accompanying drawings in which:

FIG. 15A is a sectional view of cooling plate member 23 and second cooling line 23a.

Similar reference characters refer to similar parts throughout the several views of the drawings.

DETAILED DESCRIPTION OF THE INVENTION

Those of ordinary skill in the art will realize that the following description of the present invention is illustrative only and is not intended to be in any way limiting. Other embodiments of the invention will readily suggest themselves to such skilled persons from an examination of the within disclosure.

Figure 1:
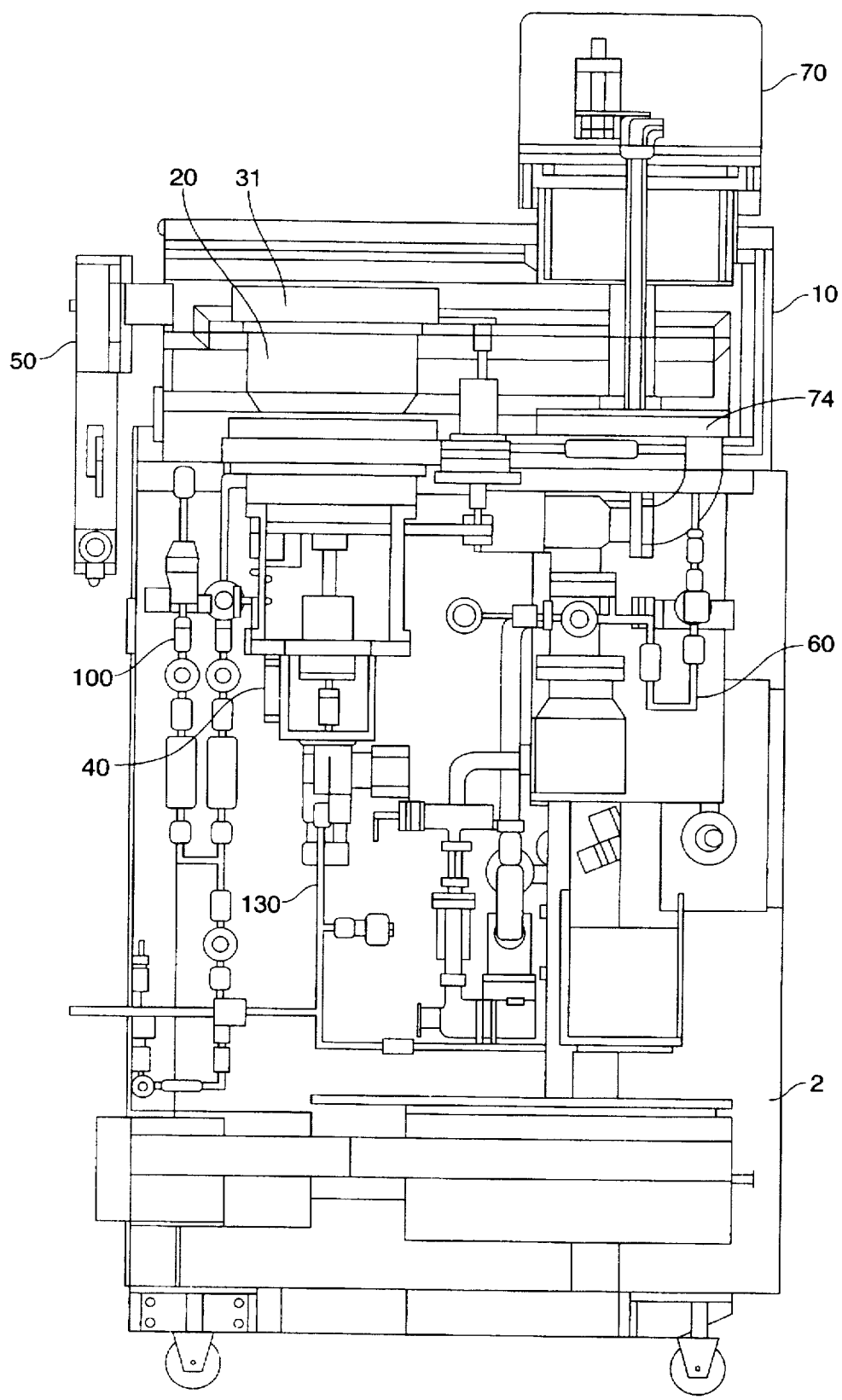
FIG. 1 is a partial sectional view of the apparatus for the thermal treatment of thin film wafers according to the present invention.
Figure 2:
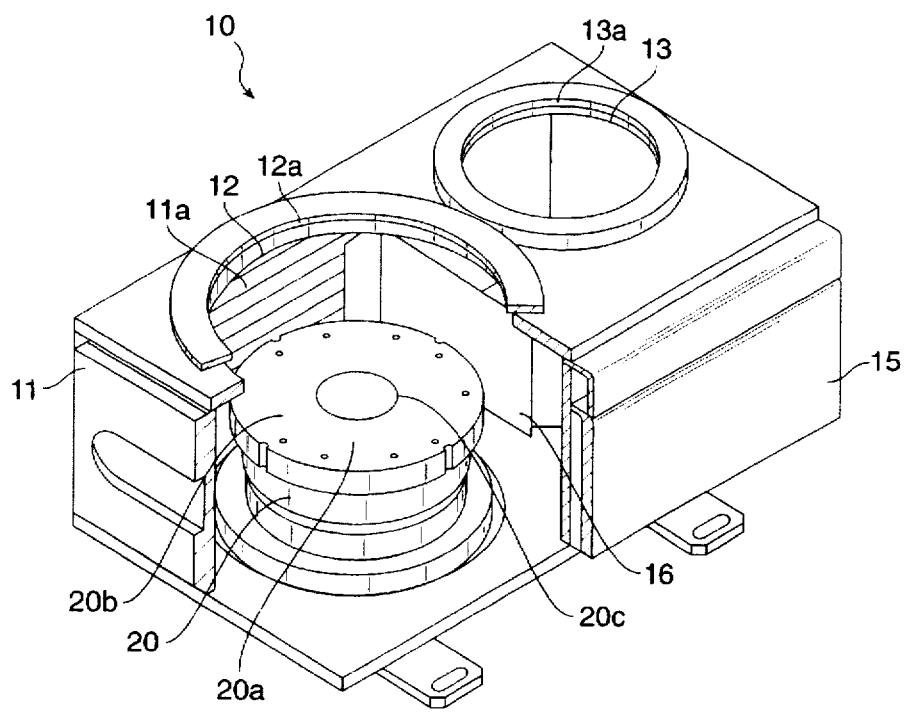
FIG. 2 is a perspective view of the vacuum chamber of FIG. 1.

Turning to FIGS. 1 and 2, a partial sectional view of the apparatus for the thermal treatment of thin film wafers according to the present invention is shown in FIG. 1 and a perspective view of the vacuum chamber 10 of FIG. 1 is shown in FIG. 2. The apparatus for thermal treatment of a wafer of the present invention includes a vacuum chamber 10; a heater assembly 20 including a heater block 20b having an upper end or top 20a positioned in vacuum chamber 10; a clamp 31 for receiving the upper end 20a of the heater assembly 20 therein and having a specific weight for pressing against the wafer (not shown) supported by the heater assembly 20 when in use; and an elevator mechanism 40 for enabling the upper end 20a of heater block 20b to engage the wafer and for allowing the weight of clamp 31 to press against the wafer.

A wafer supply mechanism 50 supplies a wafer to, positions the wafer on, and removes the wafer from clamp 31.

Vacuum generator 60 is operatively connected to the interior of vacuum chamber 10 for forming a high degree of vacuum therein. A gas supply network 100 coupled to heater assembly 20 to supply gas into vacuum chamber 10 is explained with respect to FIGS. 12 and 13 below. Cooling network 130 cools the surface of vacuum chamber 10, heater assembly 20 and a poppet plate 74 of isolation mechanism 70.

Vacuum chamber 10 is secured to a frame 2 with heater assembly 20 positioned in vacuum chamber 10. In vacuum chamber 10, a vacuum is formed which is necessary during the thermal treatment of the wafer. As shown in FIG. 2, the main body 11 of the vacuum chamber 10 has a first through hole 12 and second through hole 13 spaced apart and formed therein with flanges 12a and 13a positioned at the respective circumferences of the first and second through holes 12, 13. A vacuum chamber heater unit 15 is installed on the outside of the main body 11 of the vacuum chamber 10 for facilitating the emission of gas remaining in the vacuum chamber 10 so that a stable vacuum can be attained. Shield 16 separates heater assembly 20 from an isolation mechanism 70 which will be described later with respect to FIGS. 8–11. A first cooling line (not shown) is installed around the first and second through holes 12, 13 formed in vacuum chamber 10 and around shield 16. Heater assembly 20 is positioned in cavity 11a of vacuum chamber 10 vertically below the first through hole 12 in main body 11 of vacuum chamber 10.

Figure 3:
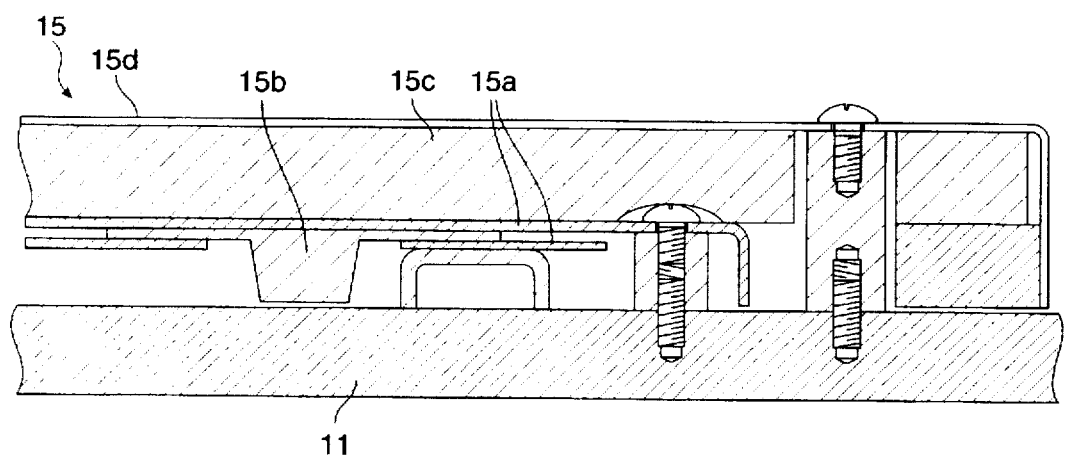
FIG. 3 is a partly broken sectional view of the vacuum chamber heater unit.

Turning now to FIG. 3, a partly broken sectional view of the vacuum chamber heater unit 15 of FIG. 2 is shown. In vacuum chamber heater unit 15, a thin film heater 15b, such as a silicone rubber heater, is installed at heat transfer member 15a, made of aluminum or the like, and an adiabatic material 15c is installed on the surface of heat transfer member 15a. The adiabatic material 15c prevents heat generated by thin film heater 15b from being emitted externally from the vacuum chamber heater unit 15 away from the main body 11 of the vacuum chamber 10 of FIG. 2. Cover 15d is coated with a material exhibiting excellent characteristics of insulation and heat resistance such as nylon and fixedly installed on adiabatic material 15c to prevent skin burns when contacted by human touch and to give a better appearance. Thin film heater 15b is preferably made to be capable of adjusting the temperature within 150° Celsius at its surface.

Figure 4:
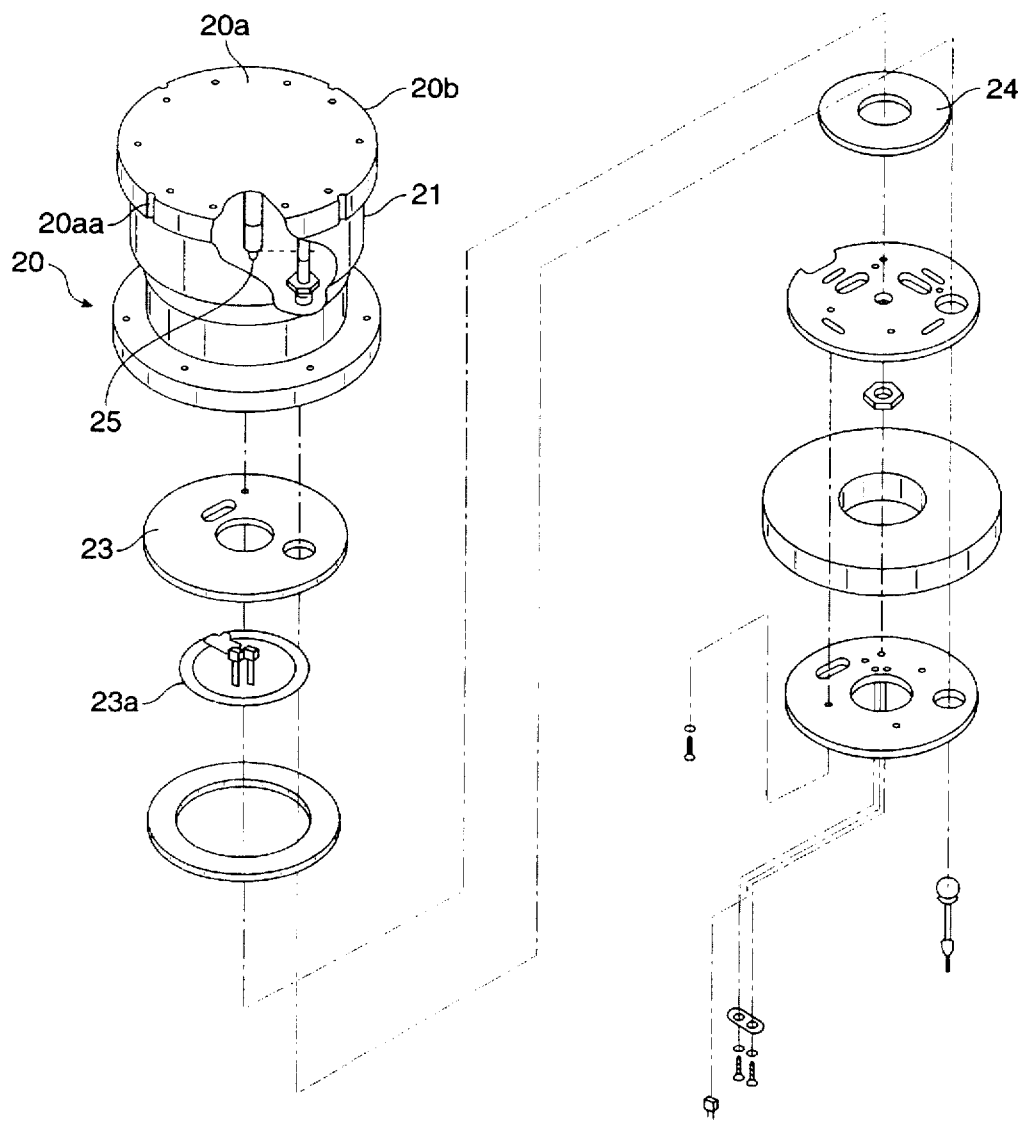
FIG. 4 is an exploded perspective view of the heater assembly.
Figure 5:
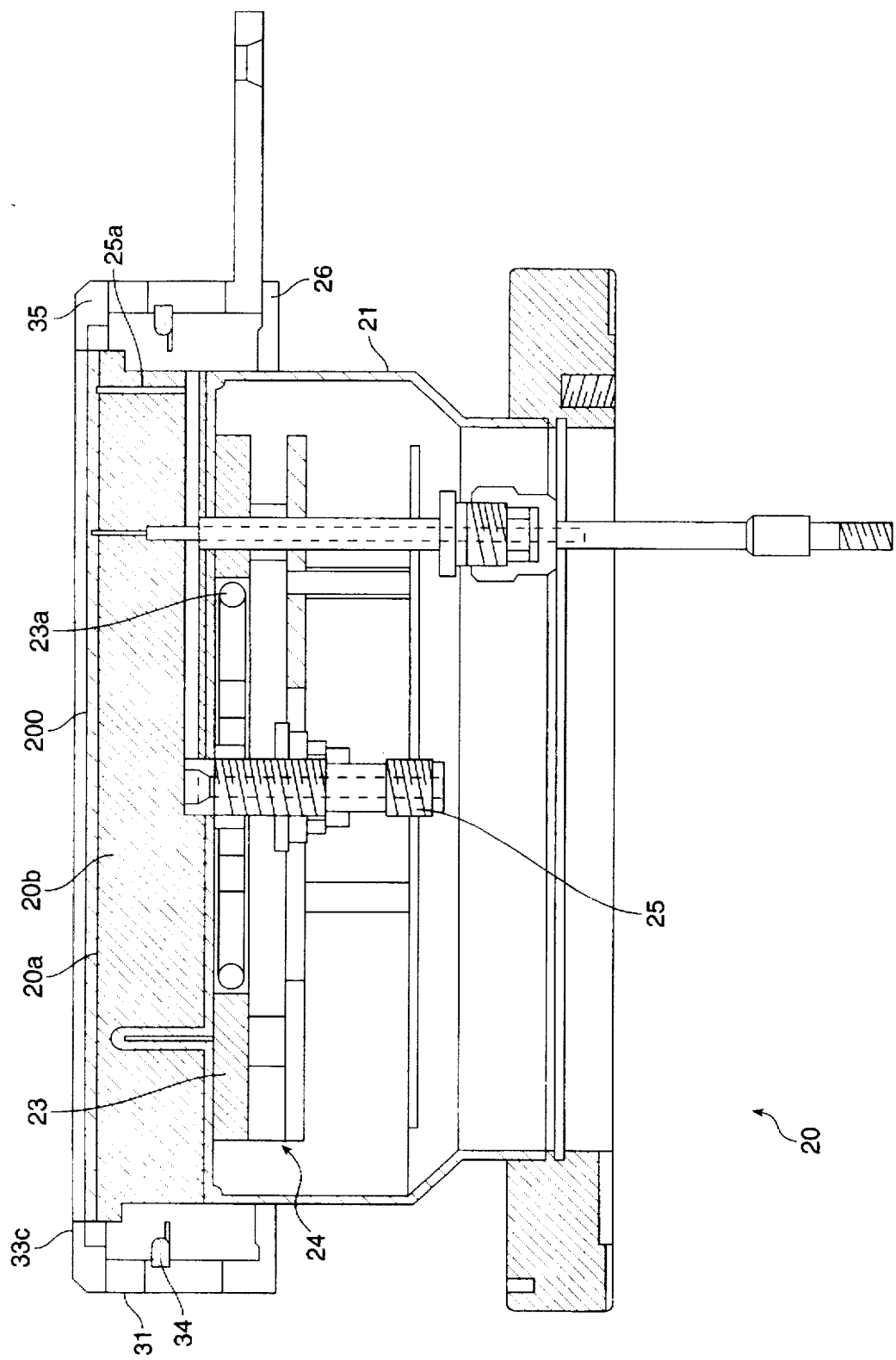
FIG. 5 is a sectional view of the heater assembly of FIG. 4 and the clamp 31 and the cap 35 of FIGS. 7A–7C.
Figure 7A:
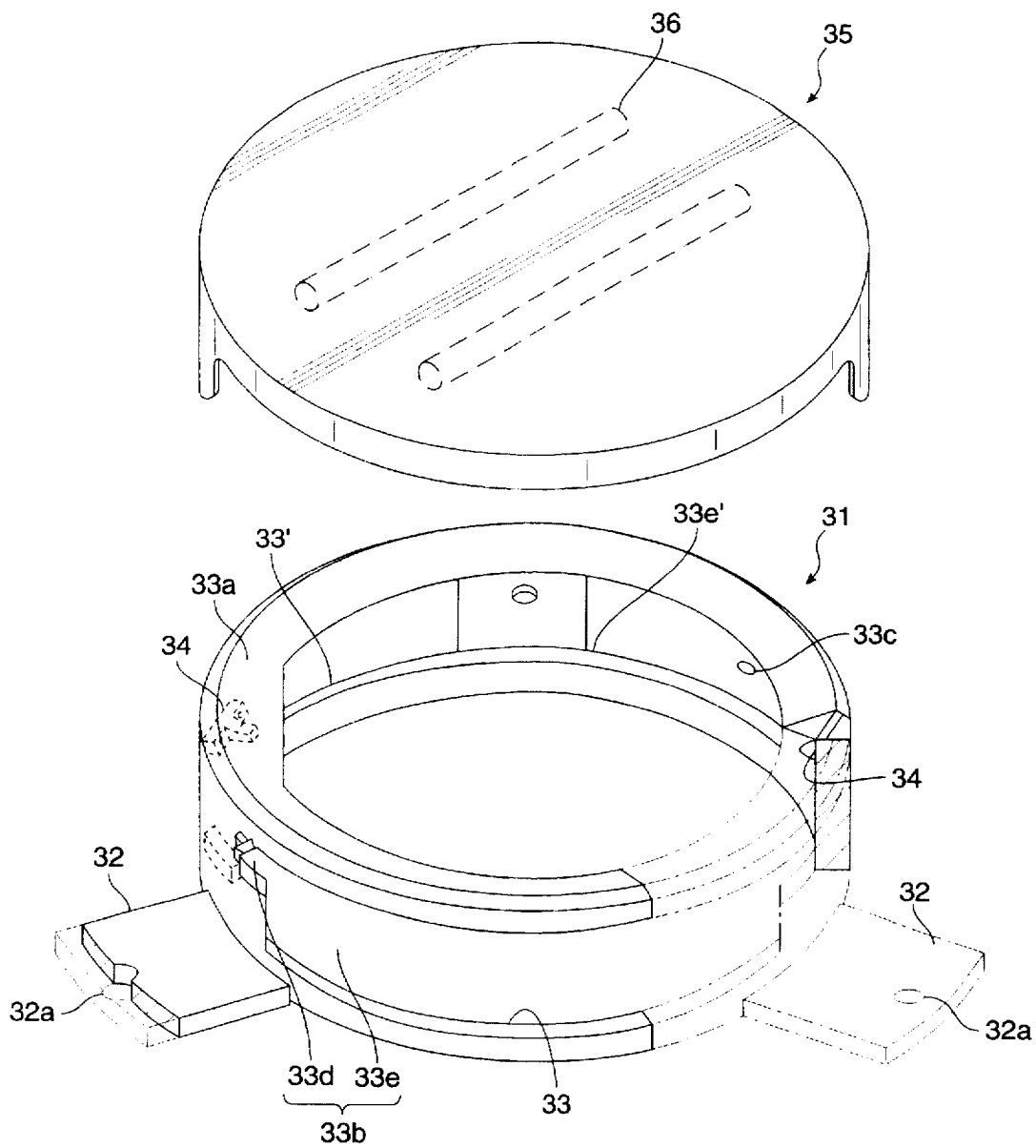
FIG. 7A is an exploded perspective view of the clamp.
Figure 7B:
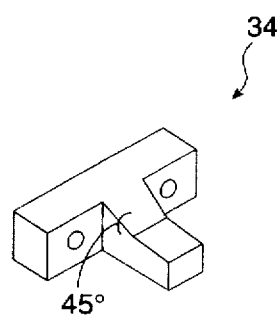
FIG. 7B illustrates finger 34.
Figure 7C:
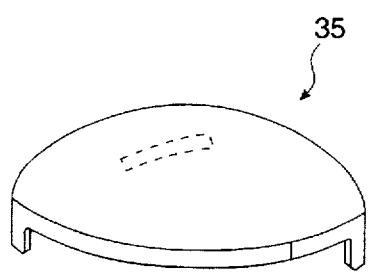
FIG. 7C illustrates dome shaped cap 35.

Turning now to FIGS. 4 and 5, an exploded perspective view of the heater assembly 20 is shown in FIG. 4 and a sectional view of the heater assembly 20 of FIG. 4 and the clamp 31 and the cap 35 of FIGS. 7A–7C are shown in FIG. 5. The heater assembly 20 includes a heater block 20b which is supported by support 21. Heater assembly 20 also includes cooling plate member 23 (of cooling network 130) which includes second cooling line 23a, as described below with respect to FIGS. 14, 15A, and 15B. Below cooling plate member 23 is heater element 24. At the lower center of heater assembly 20, conduit 25 is in gaseous communication with a plurality of gas supply holes 25a formed with predetermined spacing along the upper circumferential edge of heater block 20b. Preferably, the surface of upper end 20a of heater block 20b is inclined 20c, see FIG. 2, so as to form an upright cone, toward the center of heater block 20b so that gas supplied from the plurality of gas supply holes 25a can flow between the wafer 200 and the surface of the upper end 20a of heater block 20b. Another reason why the surface of upper end 20a of the heater block 20b is inclined 20c is to uniformly maintain the spacing between the heater block 20b and the wafer 200 at the time of wafer 200 clamping.

Guide recesses 20aa are vertically formed at the peripheral edge of heater block 20b so that fingers 34 of the clamp 31, described below with respect to FIGS. 7A–7C, can pass. Stopper 26, see FIG. 5, is positioned on the surface of support 21 to support clamp 31 in the event a wafer 200 has not been positioned on the heater block 20b in order to prevent the circumferential flange 33c of the clamp 31 from engaging the upper end 20a of the heater block 20b.

Figure 6:
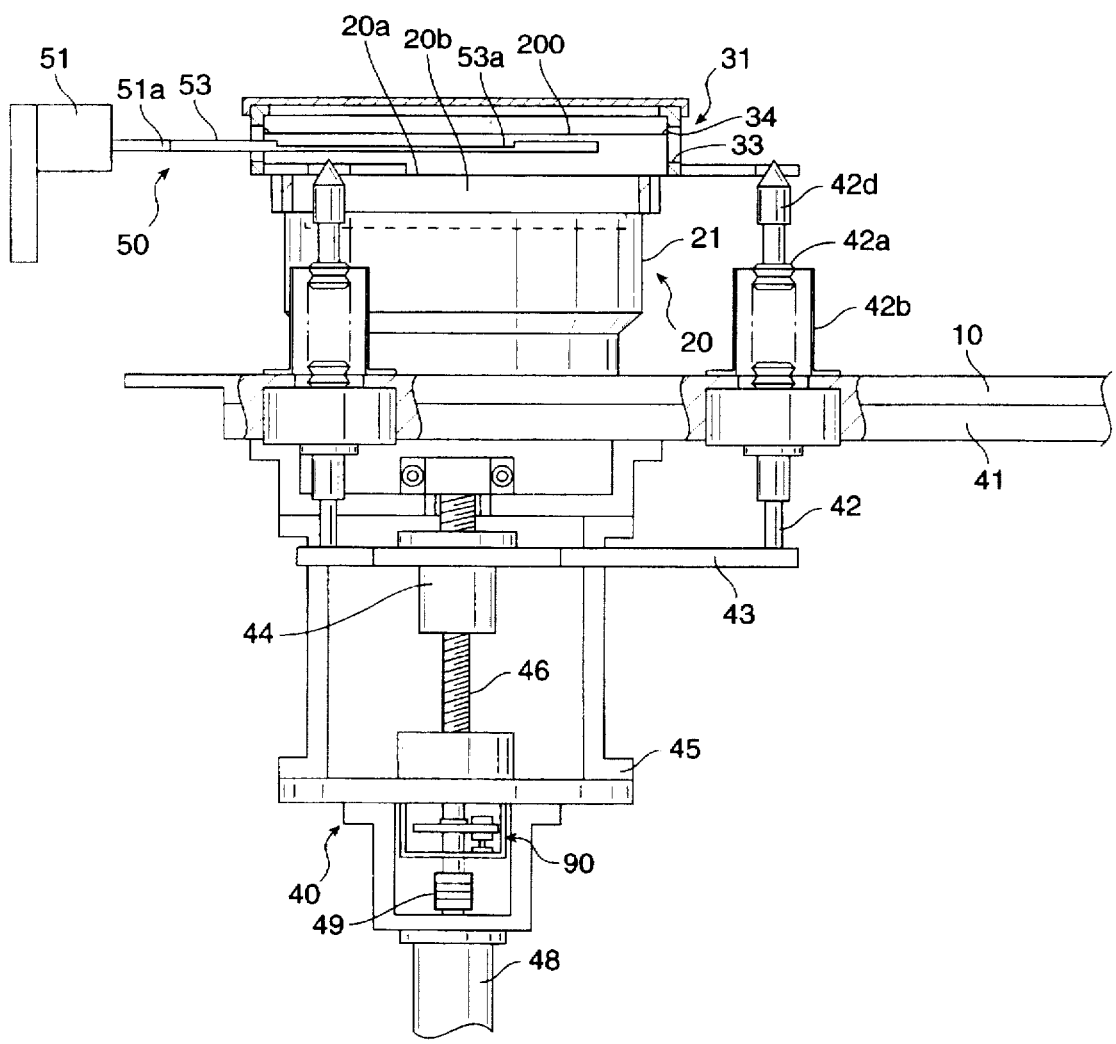
FIG. 6 is a side view of the heater assembly, the clamp, the elevator mechanism, and the wafer supply mechanism.

Turning now to FIGS. 6 and 7A–7C, a side view of the heater assembly 20, the clamp 31, the elevator mechanism 40, and the wafer supply mechanism 50 is shown in FIG. 6. FIG. 7A shows an exploded perspective view of clamp 31. FIG. 7B illustrates one of the fingers 34 of clamp 31. FIG. 7C illustrates the dome shaped cap 35. As shown in FIG. 7A, the main body 33a of clamp 31 has first and second apertures 33, 33' formed in the peripheral wall thereof through which the arm 53 of the wafer supply mechanism 50 can be inserted to position a wafer 200. Each of the first and second apertures 33, 33' is composed of a combined profile 33b consisting of a first profile 33e which is formed having a certain circumferential width, and a second profile 33d being a lengthwise extension from the first profile 33e having a greater circumferential width than the width of the first profile 33e in order to accommodate the size of the wafer 200. At least two apertures 33, 33' are symmetrically formed in clamp 31 according to the present invention to permit access of the wafer supply means 50 therethrough. The upper edge of main body 33a includes a circumferential flange 33c extending toward the center of the main body 33a.

There are at least three support members 32 radially positioned about main body 33a with each member 32 having a predetermined angular interval as seen in FIG. 7A. At the bottom surface of each support 32, a support opening 32a is formed therein for receiving a first end 42d of rod 42 of elevator mechanism 40. A plurality of fingers 34 support wafer 200 supplied by arm 53 of the wafer supply mechanism 50 and are positioned on the interior circumferential surface of clamp 31, as illustrated in FIG. 7A. Each finger 34, see FIG. 7B, is preferably equally positioned between the first profile 33e of first aperture 33 and the first profile 33e of second aperture 33' on the inner circumferential surface of clamp 31 and preferably includes a set screw (not shown) in order to permit the working position to be changed, if desired. The upper surface of the finger 34 is preferably formed with an inclined step having a predetermined angle (about 45 degrees) as shown in FIG. 7B.

Cap 35 is positioned on top of clamp 31 to cover clamp 31 and wafer 200. The configuration of the cap 35 may include openings that coincide with the first and second apertures 33, 33' of clamp 31 to allow access to the interior of the clamp 31 through the first and second apertures 33, 33' with the cap 35 in place. Cap 35 may further include a separate heat source such as lamp heaters 36. During thermal treatment, the lamp heaters 36 heat the wafer 200 from the top and the heater assembly 20 heats the wafer 200 from the bottom. Cap 35 is preferably made of a material having excellent reflective index, such as stainless steel or nickel, and, as shown in FIG. 7C, is preferably of a dome shape.

As shown in FIG. 6, wafer supply mechanism 50 is operatively positioned in front of first aperture 33 formed in clamp 31 and includes an actuator 51 having a rod 51a to which is secured arm 53 which is provided with wafer support 53a.

Elevator mechanism 40 enables the movement of the wafer 200 so as to be clamped against the surface of the upper end 20a of the heater block 20b while in use. Elevator mechanism 40 selectively moves clamp 31 relative to heater assembly 20. Elevator mechanism 40 includes base plate 41 secured to the lower surface of the bottom side of vacuum chamber 10 (in which support 21 of heater assembly 20 is installed), with at least three rods 42 vertically and slideably positioned at base plate 41. Support plate 43 connects to the second ends of each rod 42 exposed below the bottom surface of vacuum chamber 10. A transfer member 44 is secured to the center of support plate 43. A ball screw 46 with transfer member 44 are supported by a bracket 45 secured to the lower surface of the base plate 41. An actuator 48 is secured to the lower surface of bracket 45 to rotate or counter-rotate ball screw 46. Brake mechanism 90 is positioned at the lower end of ball screw 46 in order to prevent ball screw 46 from rotating by inertial force.

The first end 42d of each rod 42 is tapered to form an angle of about 90 degrees and is positioned vertically below each support hole 32a and engages each support hole 32a provided at the end of each support member 32 of clamp 31, respectively. Support plate 43 which connects the second end of each rod 42 is preferably of a triangular or a disk shape. Bellows 42a are installed at the sliding portion between the base plate 41 fixed to the vacuum chamber 10 and first rod end 42d. Shield 42b is fixed to the bottom surface of vacuum chamber 10 and encloses bellows 42a. This shield protects the bellows 42a from the emitted heat of the heater assembly 20 and prevents damage to the bellows 42a due to foreign particles. The actuator 48 preferably utilizes a servo motor or hydraulic motor.

Figure 8:
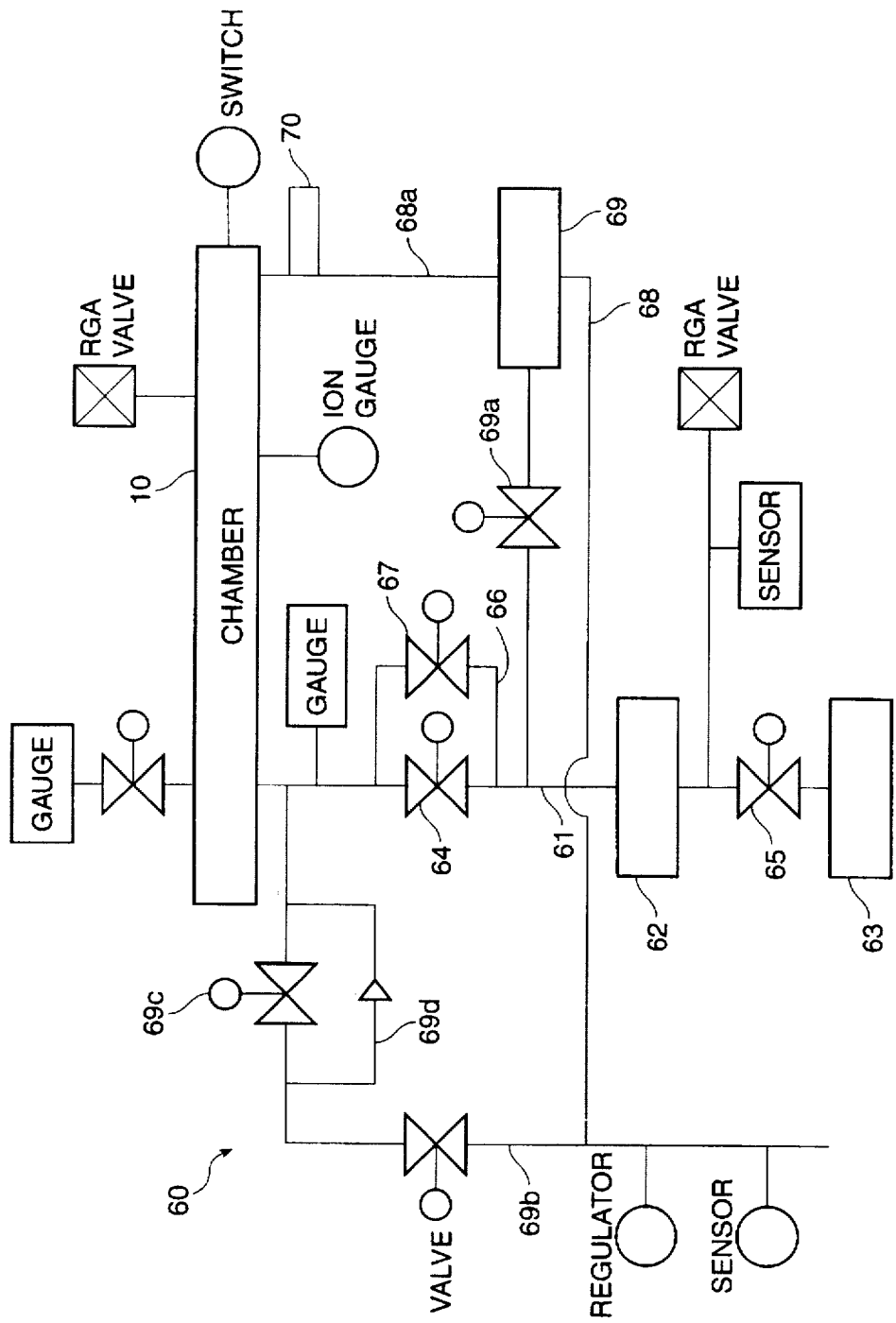
FIG. 8 is a block diagram of vacuum generator 60.

Turning now to FIG. 8, a block diagram of vacuum generator 60 is shown. Vacuum generator 60 is installed vertically below vacuum chamber 10 to maintain the interior of the vacuum chamber 10 at a high degree of vacuum, see FIG. 1. As shown in FIG. 8, a first and second vacuum pump 62, 63 are connected in serial to a first connecting pipe 61 operatively connected through the bottom surface of vacuum chamber 10 vertically below second through hole 13 of FIG. 2, and first and second valve 64, 65 are installed between vacuum chamber 10 and first vacuum pump 62 and at the first connection pipe 61 between first and second vacuum pump 62, 63, respectively. A first bypass pipe 66 in communication with first connection pipe 61 above and below the first valve 64 is installed at the first connection pipe 61, and a third valve 67 is installed on first bypass pipe 66. This prevents the generation of foreign particle laden flow since fluid flow in the vacuum chamber 10 generates a viscous flow at the time of initial vacuum in vacuum chamber 10. The first and second vacuum pump 62, 63 are preferably a drag pump and a dry pump respectively. First, second and third valves 64, 65, 67 are preferably solenoid valves.

A second connection pipe 68 of the vacuum generator 60 is installed vertically below second through hole 13, of FIG. 2, and is connected to first connection pipe 61 between first valve 64 and first vacuum pump 62. Second connection pipe 68 is installed to communicate with or be isolated from the inside of vacuum chamber 10 by an isolation mechanism 70 (see FIGS. 9–11), and a fourth valve 69a is installed on second connection pipe 68 between third vacuum pump 69 and first connection pipe 61. Third vacuum pump 69 is preferably a low temperature pump. A vacuum release gas supply pipe 69b for releasing the vacuum in vacuum chamber 10 is installed at the upper end of first connection pipe 61. A fifth valve 69c is installed on gas pipe 69b and a bypass pipe 69d is installed which connects gas pipe 69d on both sides of fifth valve 69c.

Figure 9:
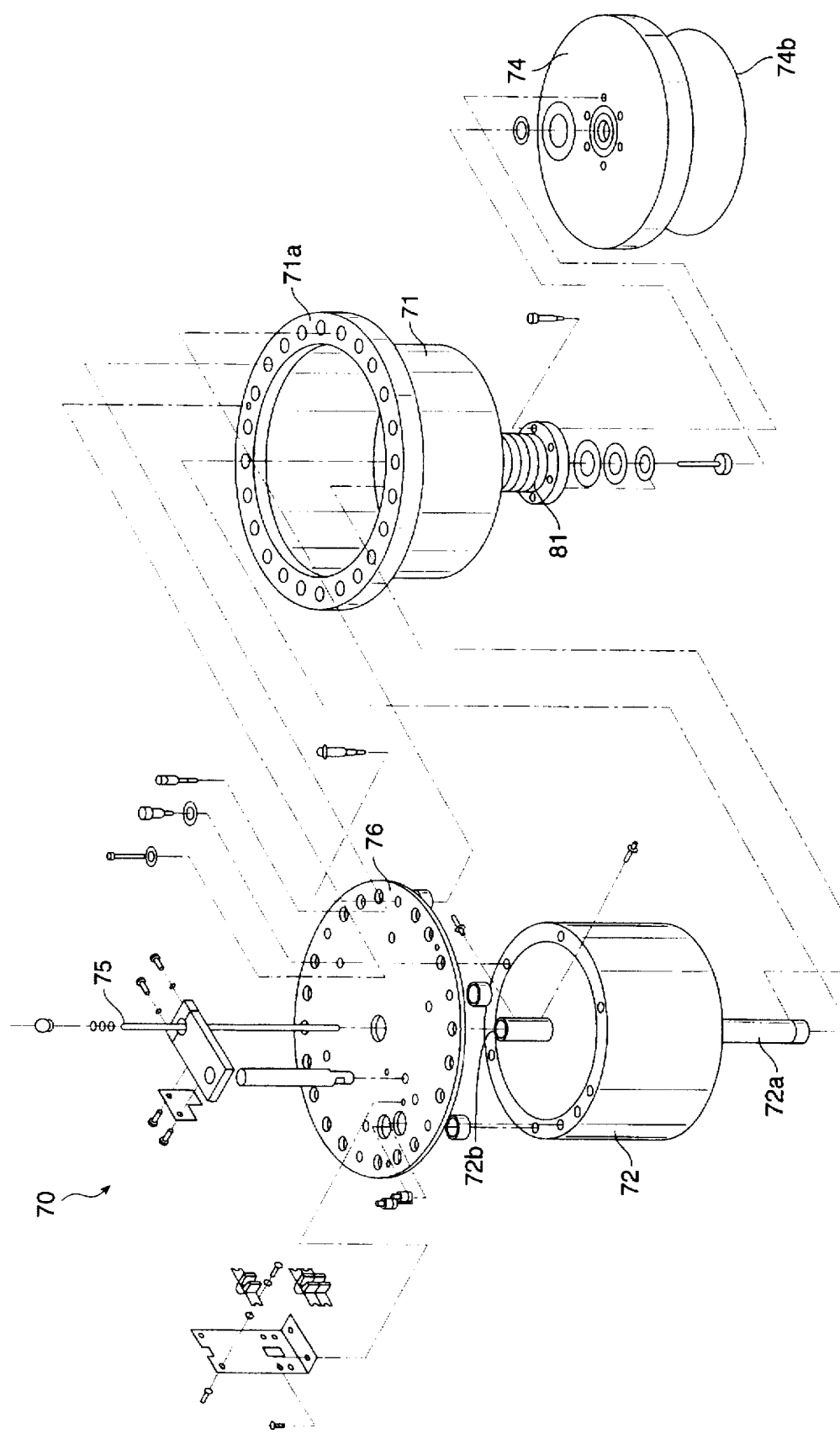
FIG. 9 is an exploded perspective view of isolation mechanism 70.
Figure 10:
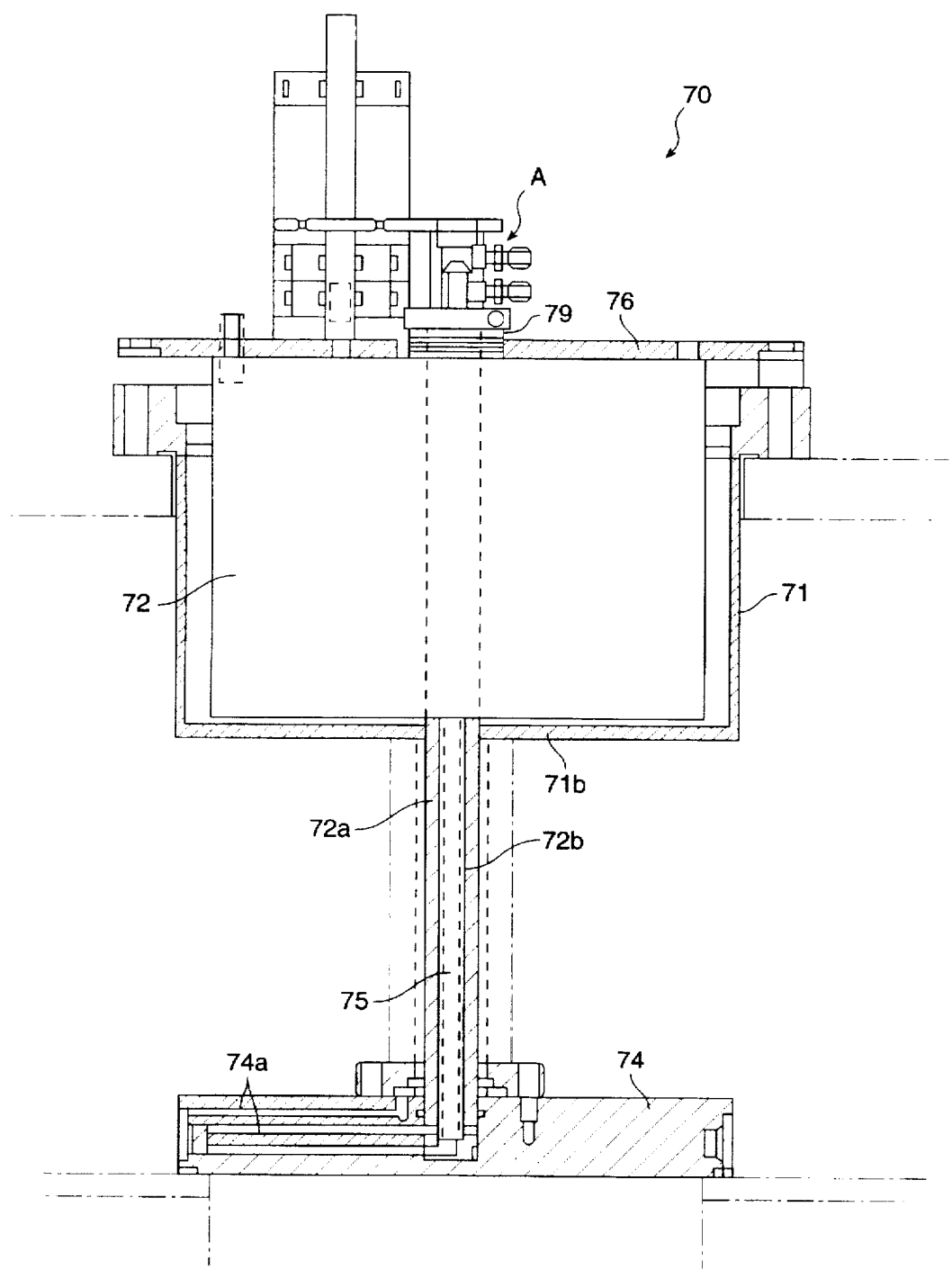
FIG. 10 is a sectional view of the isolation mechanism of FIG. 9.
Figure 11:
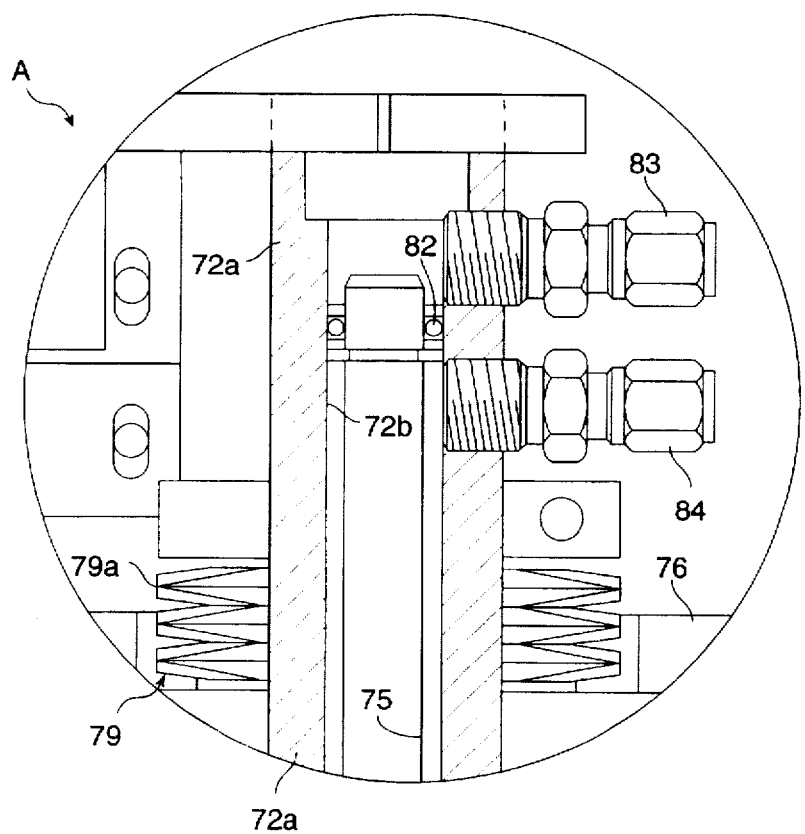
FIG. 11 is an enlarged sectional view of "A" of FIG. 10.

Turning now to FIGS. 9–11, an exploded perspective view of isolation mechanism 70 is shown in FIG. 9, a sectional view of the isolation mechanism 70 of FIG. 9 is shown in FIG. 10, and an enlarged sectional view of "A" of FIG. 10 is shown in FIG. 11. Isolation mechanism 70 isolates the inlet of second connection pipe 68a during the operation of first and second vacuum pumps 62, 63, of FIG. 8, and is positioned at flange 13a of the second through hole 13 formed in the top of vacuum chamber 10, of FIG. 2. Isolation mechanism 70 includes housing 71 having flange 71a which is connected to the edge of second through hole 13 of vacuum chamber 10. At the bottom center of the isolation mechanism 70 is provided a through hole 71b. A support member 76 is connected to flange 71a of housing 71. A cylinder 72 is positioned into housing 71, and a rod 72a, with a bore 72b, protrudes out of support member 76 and the bottom of housing 71. A poppet plate 74 is fixed to the bottom of rod 72a, and bore 72b of rod 72a is in communication with the outlet of third cooling line 74a formed inside poppet plate 74. Poppet plate 74 is in close contact with the bottom of vacuum chamber 10 in order to isolate the inlet of second connection pipe 68a thereby isolating the vacuum chamber from the first, second, and third vacuum pumps 62, 63, 69. An O-ring 74b is installed below poppet plate 74, as seen in FIG. 9. A supply pipe 75 is inserted into bore 72b of rod 72a and operatively connected to the outlet of third cooling line 74a, and supported by support member 76 so that stopping part 79 limits the lowering position of poppet plate 74. The stopping part 79 restricts the opening of the poppet plate 74 and is composed of a plurality of disk springs 79a. A bellows 81 is installed outside rod 72a between the bottom of housing 71 and the top of the poppet plate 74.

In the installation of the supply and discharge ports 83, 84 of heat exchange medium for rod 72a and supply pipe 75, as shown in FIG. 11, a packing member 82 is installed between the outer circumferential end surface of bore 72b of rod 72a and the inner circumferential end surface of supply pipe 75 to separate the inside of bore 72b. A supply port 83 for supplying a heat exchange medium to supply pipe 75 and a discharge port 84 for discharging the heat exchange medium from bore 72b are installed on the outer circumferential surface of rod 72a having packing member 82 as a boundary. This provides cooling for O-ring 74b of FIG. 9.

Figure 12:
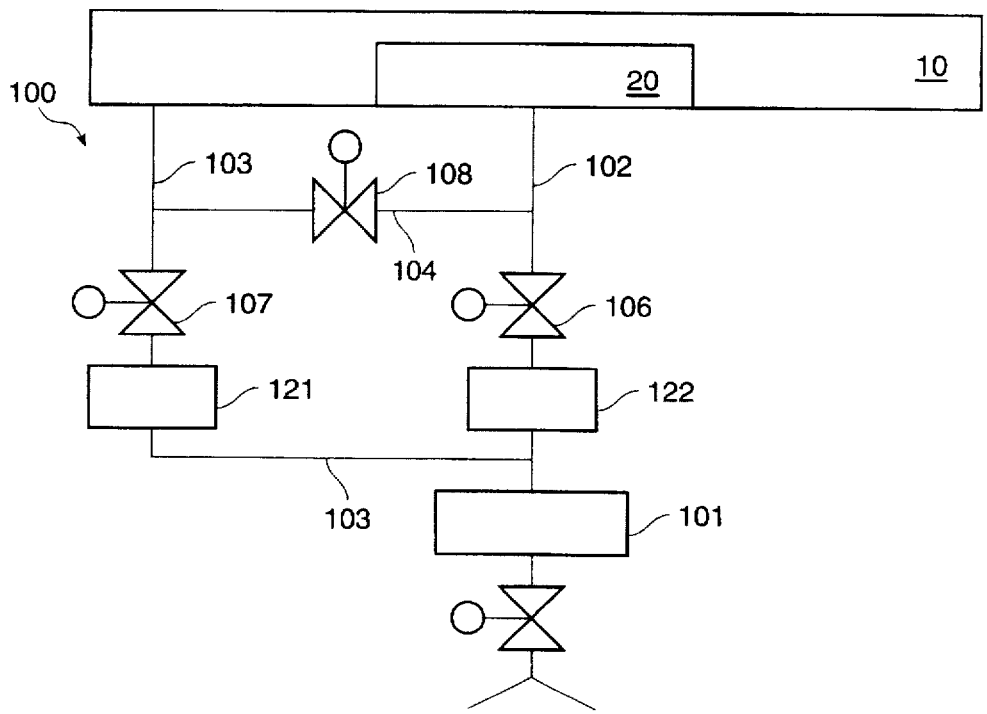
FIG. 12 is a block diagram of gas supply network 100.
Figure 13:
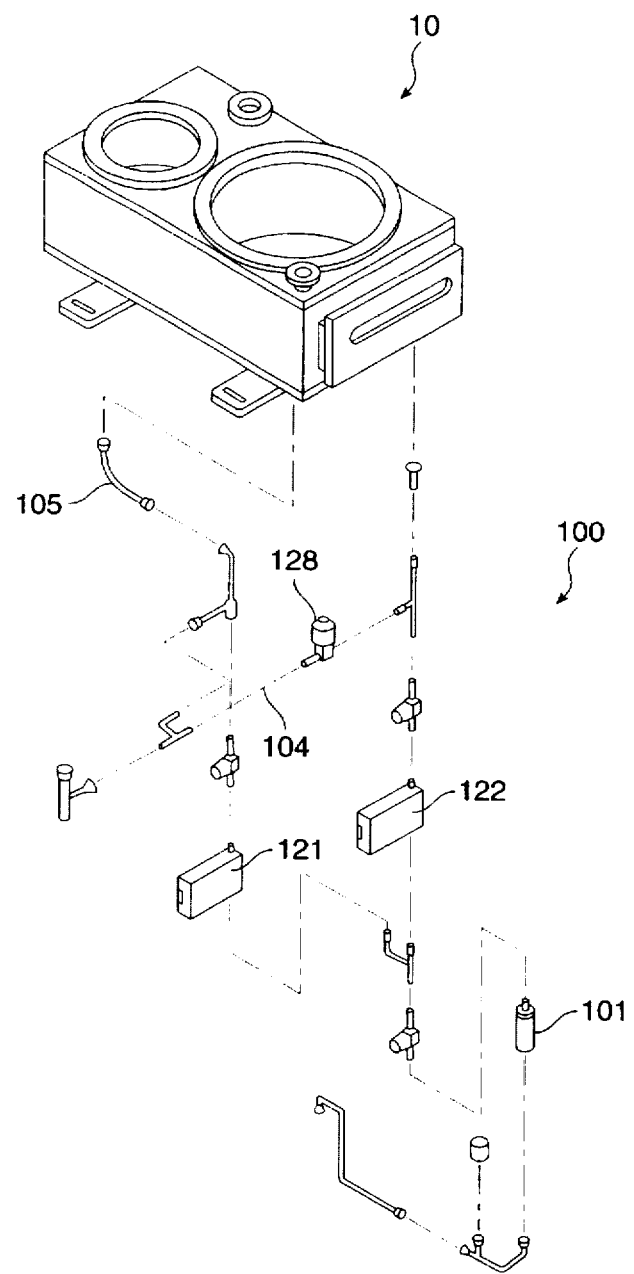
FIG. 13 is an exploded perspective view of the gas supply network.

Turning now to FIGS. 12 and 13, a block diagram of gas supply network 100 is shown in FIG. 12 and an exploded perspective view of the gas supply network 100 is shown in FIG. 13. Gas supply network 100 supplies a heat exchange medium gas such as an inert gas, e.g. argon, during heat treatment of the wafer both to the vacuum chamber 10 via pipe 103 and to heater assembly 20 via pipe 25 of FIG. 4. As shown in FIGS. 12 and 13, a fourth connection pipe 102 is connected to connection pipe 25 (see FIG. 5) being installed below heater assembly 20 with a filter 101 operatively installed on the fourth connection pipe 102. A fifth connection pipe 103 is installed to communicate with vacuum chamber 10 near the connection part of the first connection pipe 61, of FIG. 8, at vacuum chamber 10 and is connected to fourth connection pipe 102. A second bypass pipe 104 connects the fourth and fifth connection pipes 102 and 103. A seventh, eighth and ninth valves 106, 107 and 108 are operatively installed as shown in FIG. 12. First and second gas supply controllers 121 and 122 are installed at the fourth and fifth connection pipes 103 and 102, respectively, to control the gas supply.

Figure 14:
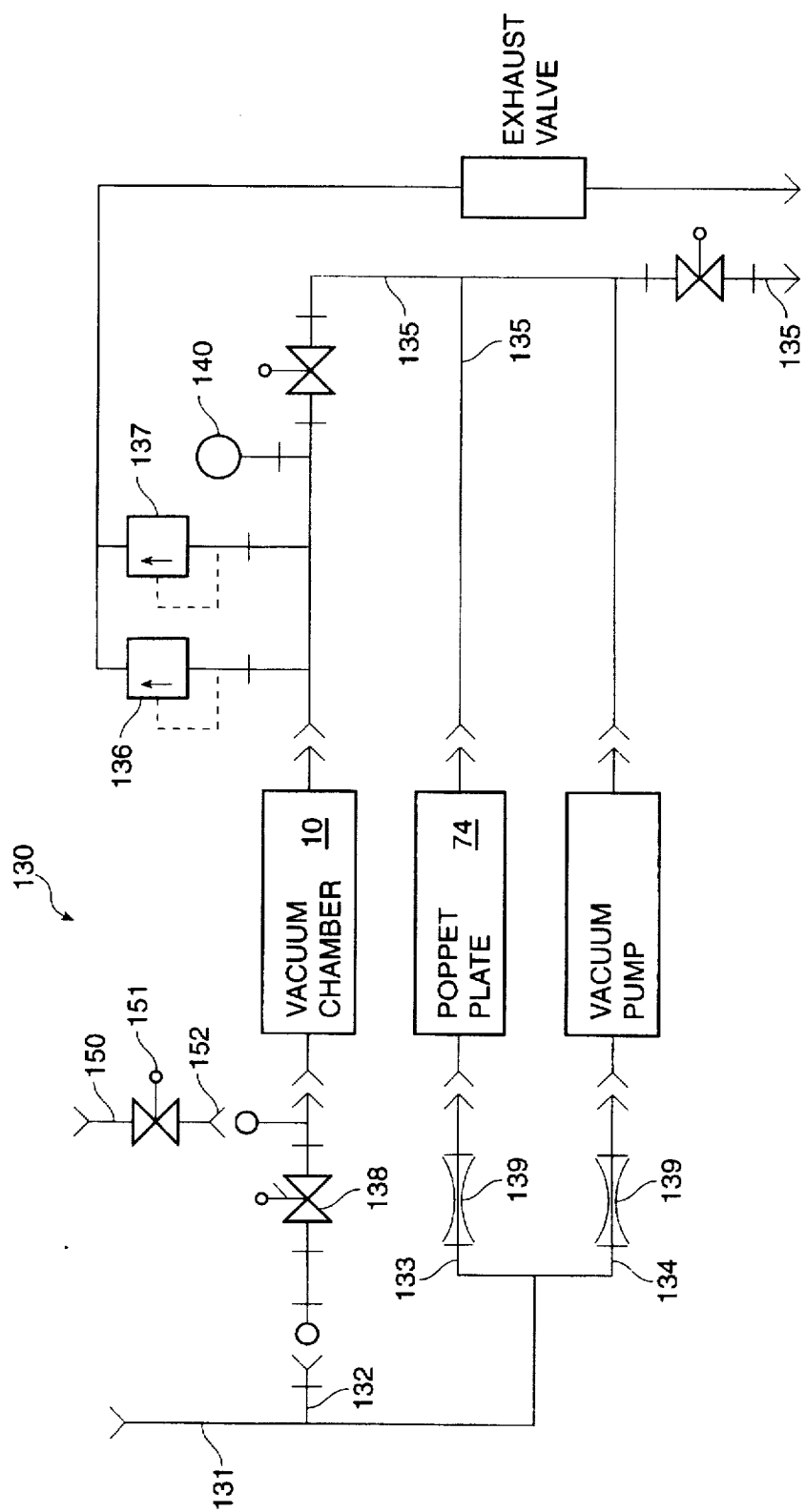
FIG. 14 is a block diagram of cooling network 130.
Figure 15A:
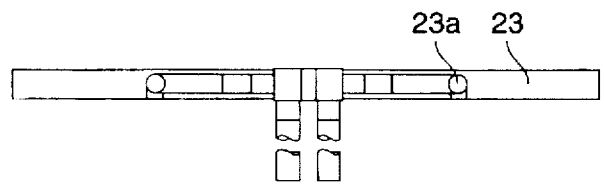
Figure 15B:
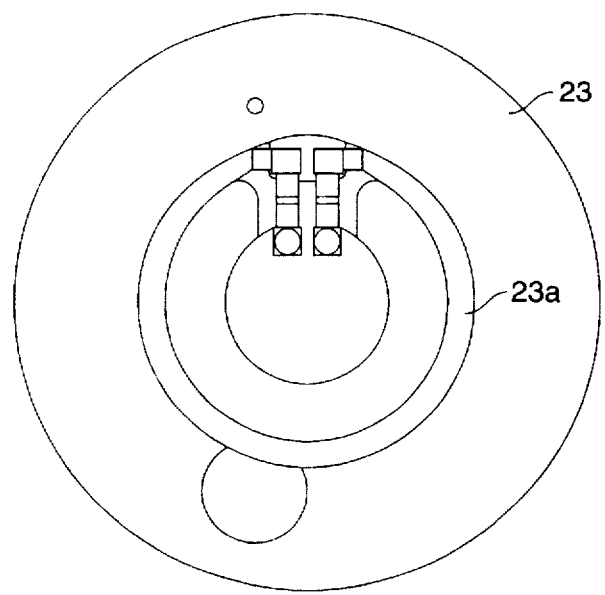
FIG. 15B is plan view of the cooling plate member.

Turning now to FIGS. 14, and 15A–15B, a block diagram of cooling network 130 is shown in FIG. 14, a sectional view of cooling plate member 23 and second cooling line 23a is shown in FIG. 15A, and a plan view of the cooling plate member 23 and the second cooling line 23a is shown in FIG. 15B. Cooling network 130 cools first, second and third cooling lines of the vacuum chamber 10, heater assembly 20 and isolation mechanism 70 by supplying them with a heat exchanging medium such as gas air or cooling fluid.

As shown in FIG. 14, a first branch pipe 132 connects a first cooling line formed on the peripheral surface of vacuum chamber 10 and second cooling line 23a of the heater assembly 20 to a heat exchanging medium supply pipe 131 being connected to a heat exchanging medium supplier (not shown) such as a pump. A second branch pipe 133 is connected to the heat exchanging medium supply pipe 131 and to supply port 83 of third cooling line 74a of isolation mechanism 70. A third branch pipe 134 is connected to the heat exchanging medium supply pipe 131 and to first vacuum pump 62. Reference number 139 represents an orifice.

A plurality of drain pipes 135 are connected to outlets of the first, second and third cooling lines. At least two relief valves 136, 137 operating at different pressures are installed at the outlet of first branch pipe 132. This is to prevent the rise of steam pressure in the cooling line when water is utilized as the cooling medium. The temperature of water in the cooling line rises due to the operation of the vacuum chamber heater unit 15 installed at the side of the vacuum chamber 10 and these valves release the pressure automatically when the pressure rises above a predetermined level. A third safety device is provided by further installing a pressure switch 140 to the first branch pipe 132.

As shown in FIGS. 15A and 15B, a tube is installed within cooling plate member 23 as second cooling line 23a of the heater assembly 20. The space between the tube and cooling plate member 23 is silver brazed to improve the heat exchanging efficiency between the tube and cooling plate member 23.

Between a valve 138, FIG. 14, installed at first branch pipe 132 and vacuum chamber 10, is connected an air supply pipe 150 to which a valve 151 and a check valve 152 are installed.

A detailed explanation of the operation of the apparatus for the thermal treatment of thin film wafers according to the present invention constructed, as described above, follows.

A method for forming a metal wiring layer by heating a wafer, on which an aluminum alloy has been deposited by utilizing a low temperature vacuum sputtering method, with the apparatus for the thermal treatment of thin film wafers as described according to the present invention includes the following steps:

Before thermal treatment of the wafer can begin, the inside of vacuum chamber 10 must be drawn down to a high degree of vacuum (below about 5×10 E-9 torr) utilizing vacuum generator 60. This is accomplished by first isolating the inlet of second connection pipe 68a connected to third vacuum pump 69 by pressing O-ring 74b against the bottom of vacuum chamber 10 with poppet plate 74 of isolation mechanism 70. Poppet plate 74 is pressed against O-ring 74b by lowering rod 72a through operation of cylinder 72 of isolation mechanism 70. Next, first valve 64 is locked and both third valve 67 and fourth valve 69a are opened. In this condition, a first predetermined vacuum pressure is formed inside vacuum chamber 10 and inside third vacuum pump 69 by low speed operation of second vacuum pump 63. When the first predetermined vacuum pressure is reached, first bypass pipe 66 is isolated by closing third valve 67 and first valve 64 is opened. In this condition, a second predetermined vacuum pressure is formed inside vacuum chamber 10 and inside third vacuum pump 69 by high speed operation of first vacuum pump 62.

When the temperature of the third vacuum pump 69 falls down to a low temperature (absolute temperature 10 to 60 degrees) and the inside of the vacuum chamber 10 reaches the second predetermined vacuum pressure, both the first valve 64 and the fourth valve 69a are closed, poppet plate 74 is raised by cylinder 72 of the isolation mechanism 70, and the third vacuum pump 69 is operated.

When the force acting on the cylinder 72 is released, the space between the bottom surface of vacuum chamber 10 and poppet plate 74 is maintained to a predetermined spacing (about ½ inch) by a stopping part 79 composed of a disk spring supported by a support member 76 combined with the housing 71.

In this condition, vacuum chamber heater unit 15 installed on the outer surface of vacuum chamber 10 is operated to heat vacuum chamber 10. Therefore, even the gas absorbed by the inside of vacuum chamber 10 and the inner walls of the vacuum chamber 10 are discharged so that the inside of the vacuum chamber 10 is maintained to a high degree of vacuum and super cleanness. While the inside of the vacuum chamber 10 is maintained at a high degree of vacuum, the cooling water, which is the heat exchange medium supplied by heat exchange medium supply pipe 131 of cooling network 130 is supplied to the water jacket of the third cooling line 74a of poppet plate 74 through heat exchange medium supply pipe 75 and the supply port 83 of isolation mechanism 70 in order to cool poppet plate 74. Therefore, heat damage to O-ring 74b installed below poppet plate 74 can be prevented, and the gas flowing into the third vacuum pump 68, which is a low temperature pump, can be cooled.

When the inside of vacuum chamber 10 reaches a high degree of vacuum, as described above, the wafer 200 is supplied to the heater assembly 20 which is installed inside the vacuum chamber 10. To do this, first actuator 48 of elevator mechanism 40 is operated to rotate ball screw 46, thereby rotating transfer member 44 threadably connected to ball screw 46 in order to raise support plate 43. As support plate 43 is raised, rods 42 travel upward whereupon the first end 42d of rod 42 is inserted into support hole 32a provided at each support 32 of clamp 31. Support plate 43 is raised further so that clamp 31 is raised above heater assembly 20. Actuator 51 of wafer supply mechanism 50 is operated such that wafer 200 mounted on support 53a of arm 53 connected to rod 51a of the actuator 52 is inserted into the first aperture 33 of the clamp 31. At this time, wafer 200 supported by support 53a is positioned above fingers 34. When the insertion of the wafer 200 by the support 53a is completed, either arm 53 is lowered by wafer supply mechanism 50 or clamp 31 is raised by elevator mechanism 40 to a predetermined height in order to position arm 53 within the first profile 33e so that wafer 200 is now supported by fingers 34 fixed to the inner surface of the clamp 31. When wafer 200 is supported by fingers 34, the actuator 54 is operated to withdraw arm 53 out of the first aperture 33 of clamp 31.

When the wafer 200 is supported by fingers 34 of clamp 31, the actuator 48 of elevator mechanism 40, supported by bracket 45, is operated to rotate ball screw 46. As ball screw 46 is rotated, transfer member 44 is lowered so that rods 42 are lowered. As rods 42 are lowered, clamp 31 is lowered to be placed on heater assembly 20 and fingers 34 of clamp 31 pass along the guide recesses 20aa formed on the peripheral edge of heater block 20b so that wafer 200 supported by fingers 34 is placed on top of heater block 20b.

With wafer 200 placed on top of the heater block 20b, if rods 42 are further lowered, the circumferential flange 33c formed at the upper edge of clamp 31 pushes against the edge of wafer 200 seated on the heater block 20b. In this condition, actuator 48 is operated so that the first end 42d of rods 42 is separated from support hole 32a provided on support 32 of clamp 31. In this way, the circumferential flange 33c of clamp 31 pushes against the edge of the wafer 200 with the force of the weight of the clamp 31. Therefore, deformation or breakage of the wafer due to excessive clamping force on wafer 200 against the heater block 20b is eliminated.

The wafer 200 is thermally treated by heater assembly 20 which is heated by heater element 24 installed below heater block 20b with the wafer 200 positioned thereon as described above. The entire surface of the wafer 200 can be heated with uniform speed from both the top and bottom surface of the wafer 200 if when cap 35 is placed on the top of clamp 31 to seal the opening of the clamp 31, a separate heat source, such as a lamp heater 36, see FIG. 7A, is provided inside cap 35. As described above, during the process of heating the wafer 200 with heater assembly 20, gas is supplied from the fourth connection pipe 102 of the gas supply network 100 through connection pipe 25 and through gas penetration holes 25a which are uniformly spaced along the top circumferential edge of the heater block 20b as seen in FIG. 2. Heater block 20b is provided with an inclination 20c which rises from the edge of heater block 20b to the center thereof. Therefore, gas flows from the edge to the center between heater block 20b and wafer 200 so as to heat the wafer 200 to a uniform temperature. At this time, vacuum chamber 10 must be maintained at a predetermined pressure, and the pressure is adjusted both by the gas supplied to the heater assembly 20 and by gas supplied through the fifth connection pipe 103 or the second bypass pipe 104.

Upon completion of the thermal treatment of wafer 200 as described above, wafer 200, seated on the heater block 20b, is removed. A detailed explanation of the removal process follows.

To remove wafer 200, the inflow of gas supplied from the above described two places, see FIG. 12, is stopped by opening valve 108 installed on the second bypass pipe 104. Then actuator 48 of elevator mechanism 40 is operated to raise ball screw 46 and support plate 43 (supported on transfer member 44 combined with ball screw 46) so that the first end 42d of rod 42 (supported by support plate 43) is inserted into support hole 32a of the support 32 of clamp 31. In this condition, rods 42 are further raised, raising clamp 31. When clamp 31 is raised, the clamping of the wafer 200 by the circumferential flange 33c is released. Fingers 34 formed on the inner circumferential surface of clamp 31 now move along guide recesses 20aa formed on the peripheral edge of heater block 20b so that fingers 34 touch the edge of the wafer 200 and support the wafer 200.

In the condition described above, clamp 31 is further raised by rod 42 until first profile 33e of first aperture 33 formed at the peripheral surface of the clamp 31 is positioned in front of arm 53 of wafer supply means 50. Then actuator 51 of wafer supply means 50 is operated to insert arm 53 into the first aperture 33 so that wafer support 53a provided at the end of arm 53 is placed below wafer 200 supported by fingers 34. In this condition, either clamp 31 is lowered by elevator means 40 or arm 53 is raised by wafer supply means 50 so that wafer 200 is supported by wafer support 53a of arm 53 and arm 53 is positioned adjacent the second profile 33d of first aperture 33. Then actuator 51 is again operated to remove arm 53 out of the second profile 33d of the first aperture 33 in order to pull wafer 200 out of clamp 31.

Wafer 200 is repeatedly thermally treated by the operation as described above. When the thermal treatment of the wafer 200 is completed, the apparatus for thermal treatment of a thin film wafer is cooled, and the cooling takes many hours since the inside of the vacuum chamber 10 is in a condition of a high degree of vacuum. Therefore, cooling network 130 must be used to cool heater assembly 20. To cool heater assembly 20, a heat exchange medium must be supplied to the second cooling line 23a installed at cooling plate member 23 via the heat exchanging medium supply pipe 131 and the first branch pipe 132 of the cooling network 130. Heat exchange mediums include gas, e.g. air, and fluid, e.g. cooling water. Where the heater assembly 20 has been heated to high temperature, the heater assembly 20 is cooled initially by supplying air to the second cooling line 23a by closing valve 138 installed on first branch pipe 132 and opening valve 151 of air supply pipe 150 connected to first branch pipe 132, and then, once the temperature of heater assembly 20 falls down to a predetermined temperature (about 200° C.), the heater assembly 20 is cooled further by supplying cooling water to the second cooling line 23a by isolating valve 151 installed on air supply pipe 150 and opening valve 138 installed on first branch pipe 132.

As described above, the apparatus for thermal treatment of a thin film wafer of the present invention can maintain the inside of the vacuum chamber to high degree of vacuum, heat the entire surface of the wafer to a uniform temperature, prevent the diffusion of foreign particles due to the movement/swirling of gas in the vacuum chamber, and cool the heater assembly within a short time so as to prevent the erosion of the heater element and protect the heater power source. In addition, the present invention can significantly improve the yield of thermally treated wafers.

While illustrative embodiments and applications of this invention have been shown and described, it would be apparent to those skilled in the art that many more modifications than have been mentioned above are possible without departing from the inventive concepts set forth herein. The invention, therefore, is not to be limited except in the spirit of the appended claims.

What is claimed is:

1. An apparatus for thermal treatment of a thin film wafer having a peripheral edge, comprising:

a vacuum chamber;

a heater assembly for heating the wafer, said heater assembly having a heater block and being operatively positioned inside said vacuum chamber;

a clamp positioned in said vacuum chamber above said heater assembly, said clamp having a top and an open bottom for receiving said heater assembly through said bottom and having a specific weight for pressing against the wafer supported by said heater block;

an elevator mechanism for positioning said clamp relative to said heater assembly such that during thermal treatment of the wafer only said weight of said clamp presses against the wafer;

a vacuum generator for forming a vacuum inside said vacuum chamber, said vacuum generator having a first connection pipe in communication with the interior of said vacuum chamber and operatively connected in series to a first valve, a first vacuum pump and a second vacuum pump, a second connection pipe having an inlet in communication with the interior of said vacuum chamber and operatively connected to said first connection pipe, and a third vacuum pump operatively connected to said second connection pipe;

a gas supply network for providing gas to at least one surface of the wafer during thermal treatment to assist in maintaining the wafer at a uniform temperature during thermal treatment; and an isolation mechanism for selectively opening and closing said inlet of said second connection pipe.

2. The apparatus according to claim 1, wherein said vacuum generator further comprises a first bypass pipe having a first end and a second end, said bypass pipe connecting to said first connection pipe with one end connected to either side of said first valve, said bypass pipe having a second valve for controlling the bypassing of said first connection pipe by said bypass pipe.

3. The apparatus according to claim 1, wherein said third vacuum pump of said vacuum generator is a low temperature pump.

4. The apparatus according to claim 1, wherein said isolation mechanism comprises:

a housing having a cavity formed therein and a flange;

a support member connected to said flange;

a cylinder positioned in said cavity;

a rod which protrudes from the bottom of said housing and the top of said support member;

a poppet plate which is installed at the end of said rod protruding from the bottom of said housing and is in close contact with the bottom of said vacuum chamber and is over said inlet of said second connection pipe of said vacuum generator; and a sealing member installed at the bottom of said poppet plate, wherein said isolation mechanism can selectively close and open said inlet of said second connection pipe.

5. The apparatus according to claim 4, wherein said sealing member of said isolation mechanism is an O-ring.

6. The apparatus according to claim 4, wherein said isolation mechanism further comprises a stopping part which is supported by said support member to set the position of said poppet plate so that said poppet plate is spaced a predetermined distance above the bottom of said vacuum chamber at the time when said isolation mechanism is not closing off said inlet of said second connection pipe.

7. The apparatus according to claim 6, wherein said stopping part of said isolation mechanism comprises a stack of a plurality of disk springs having an outer edge which is supported by said support member and a center which is supported by the peripheral surface of said rod.

8. An apparatus for thermal treatment of a thin film wafer having a peripheral edge, comprising:

a vacuum chamber;

a heater assembly for heating the wafer, said heater assembly having a heater block and being operatively positioned inside said vacuum chamber;

a clamp positioned in said vacuum chamber above said heater assembly, said clamp having a top and an open bottom for receiving said heater assembly through said bottom and having a specific weight for pressing against the wafer supported by said heater block;

an elevator mechanism for positioning said clamp relative to said heater assembly such that during thermal treatment of the wafer only said weight of said clamp presses against the wafer;

a vacuum generator for forming a vacuum inside said vacuum chamber; and a gas supply network for providing gas to at least one surface of the wafer during thermal treatment to assist in maintaining the wafer at a uniform temperature during thermal treatment, said gas supply network having a first connection pipe which is formed at the bottom of said heater block and communicates with a plurality of through holes formed at the top of said heater block, a second connection pipe connected to said first connection pipe, a third connection pipe one end of which is connected to said second connection pipe and the other end of which communicates with said vacuum chamber, a first gas supply controller operatively connected in series with said second connection pipe, a second gas supply controller operatively connected in series with said third connection pipe, and a bypass pipe which connects said second and third connection pipes and to which a valve is installed.

9. An apparatus for thermal treatment of a thin film wafer having a peripheral edge, comprising:

a vacuum chamber;

a heater assembly for heating the wafer, said heater assembly having a heater block and being operatively positioned inside said vacuum chamber;

a clamp positioned in said vacuum chamber above said heater assembly, said clamp having a top and an open bottom for receiving said heater assembly through said bottom and having a specific weight for pressing against the wafer supported by said heater block;

an elevator mechanism for positioning said clamp relative to said heater assembly such that during thermal treatment of the wafer only said weight of said clamp presses against the wafer;

a vacuum generator for forming a vacuum inside said vacuum chamber, said vacuum generator having a connection pipe having an inlet in communication with the interior of said vacuum chamber;

an isolation mechanism for selectively opening and closing said inlet of said connection pipe of said vacuum generator through operation of a poppet plate and a sealing member;

a gas supply network for providing gas to at least one surface of the wafer during thermal treatment to assist in maintaining the wafer at a uniform temperature during thermal treatment; and a cooling network for cooling said heater block, said vacuum chamber and said poppet plate.

10. The apparatus according to claim 9, wherein said cooling network comprises a plurality of branch pipes which are connected to a first cooling line installed to a cooling plate member of said heater assembly, a second cooling line installed at said poppet plate of said isolation mechanism and a third cooling line installed at the peripheral surface of said vacuum chamber, respectively, a heat exchanging medium supply pipe connected to each of said plurality of branch pipes to supply a heat exchanging medium and at least one drain pipe connected to the outlets of said first, second and third cooling lines.

11. The apparatus according to claim 10, wherein said cooling network further comprises a plurality of relief valves operating at different pressures installed at a drain pipe connected to an outlet of said third cooling line of said vacuum chamber.

12. The apparatus according to claim 11, wherein said cooling network further comprises a pressure switch installed on said drain pipe connected to said outlet of said third cooling line of said vacuum chamber.

13. The apparatus according to claim 10, wherein said first cooling line installed at said heater assembly is composed of a tube installed at said cooling plate member.

14. The apparatus according to claim 13, wherein the space between said tube and said cooling plate member is silver brazed.

15. The apparatus according to claim 10, wherein said second cooling line installed at said poppet plate of said isolation mechanism is connected to the outlet of a water jacket formed at said poppet plate.

16. The apparatus according to claim 10, wherein said cooling network further comprises an air supply pipe installed with a valve, said air supply pipe is in communication with one of said plurality of branch pipes which is connected to said third cooling line of said vacuum chamber.

* * * * *